(12) United States Patent
Marx et al.

(10) Patent No.: US 7,738,113 B1
(45) Date of Patent: Jun. 15, 2010

(54) WAFER MEASUREMENT SYSTEM AND APPARATUS

(75) Inventors: David S. Marx, Westlake Village, CA (US); David L. Grant, Thousand Oaks, CA (US); Michael A. Mahoney, Chatsworth, CA (US); Tsan Yuen Chan, San Gabriel, CA (US)

(73) Assignee: Tamar Technology, Inc., Newbury Park, CA (US)

( * ) Notice: Subject to any disclaimer, the term of this patent is extended or adjusted under 35 U.S.C. 154(b) by 0 days.

(21) Appl. No.: 11/978,881

(22) Filed: Oct. 29, 2007

Related U.S. Application Data

(62) Division of application No. 11/527,902, filed on Sep. 26, 2006.

(60) Provisional application No. 60/721,554, filed on Sep. 29, 2005, provisional application No. 60/787,639, filed on Mar. 31, 2006, provisional application No. 60/754,018, filed on Dec. 27, 2005.

(51) Int. Cl.
*G01B 11/02* (2006.01)

(52) U.S. Cl. ....................................................... 356/496

(58) Field of Classification Search ................. 356/626, 356/630, 631, 485, 489, 495, 496, 497, 503, 356/511, 516
See application file for complete search history.

(56) References Cited

U.S. PATENT DOCUMENTS

| | | | |
|---|---|---|---|
| 6,806,969 B2 * | 10/2004 | Clifford et al. .............. 356/630 |
| 6,822,745 B2 * | 11/2004 | De Groot et al. ............ 356/496 |
| 6,847,458 B2 | 1/2005 | Freischlad et al. |
| 6,878,301 B2 * | 4/2005 | Mundt .......................... 216/83 |
| 6,897,957 B2 | 5/2005 | Meeks |
| 6,937,351 B1 | 8/2005 | Weaver et al. |
| 2004/0109170 A1 * | 6/2004 | Schick ........................ 356/614 |
| 2005/0128487 A1 * | 6/2005 | Hill ............................. 356/496 |
| 2006/0109483 A1 | 5/2006 | Marx et al. |
| 2007/0206197 A1 * | 9/2007 | Buckland et al. ............ 356/479 |

* cited by examiner

*Primary Examiner*—Tarifur Chowdhury
*Assistant Examiner*—Jonathan M Hansen
(74) *Attorney, Agent, or Firm*—Albert O. Cota

(57) ABSTRACT

A method and apparatus for the measurement of wafer thickness, flatness and the trench depth of any trenches etched thereon using the back surface of the wafer to accurately measure the back side of a trench, rendering the trench an effective bump, capable of being measured on the top surface and the bottom surface through a non-contact optical instrument that simultaneously measures the wavelength of the top surface and bottom surface of the wafer, converting the distance between wavelengths to a thickness measurement, using a light source that renders the material of which the wafer is composed transparent in that wavelength range, i.e., using the near infrared region for measuring the thickness and trench depth measurement of wafers made of silicon, which is opaque in the visible region and transparent in the near infrared region. Thickness and flatness, as well as localized shape, can also be measured using a calibration method that utilizes a pair of optical styli.

9 Claims, 16 Drawing Sheets

SECTION A-A
SCALE 1:6

WAFER MEASUREMENT SYSTEM AND APPARATUS

REFERENCE TO PRIOR APPLICATION

This application is a voluntary divisional application that claims the priority of non-provisional application filed Sep. 26, 2006 with Ser. No. 11/527,902, which claims priority of provisional application 60/721,554, filed Sep. 29, 2005 entitled WAFER THICKNESS AND FLATNESS MEASUREMENT SYSTEM by David L. Grant, David S. Marx, Michael A. Mahoney and Tsan Yuen Chen, and provisional application 60/787,639, filed Mar. 31, 2006 entitled IMPROVED WAFER TRENCH DEPTH MEASUREMENT SYSTEM by David S. Marx and David L. Grant and provisional application 60/754,018, filed Dec. 27, 2005 entitled WAFER THICKNESS AND FLATNESS MEASUREMENT SYSTEM by David S. Marx, David L. Grant, Michael A. Mahoney, and Tsan Yuen Chen.

BACKGROUND OF THE INVENTION

1. Field of the Invention

The present invention relates generally to the field of the measurement of silicon wafers used in the production of semiconductors, and particularly to the measurement of the thickness of thin wafers, the flatness and localized shape of thin wafers and the depth of trenches etched thereon.

2. Description of the Prior Art

When making semiconductors, manufacturers start with blank silicon wafers. Many processes are performed on them before the completed semiconductors are complete and a large number of these processes involve placing images of a photo mask on the wafer. The various images must overlay each other with great accuracy. As the size of the features on the wafer shrink, the accuracy with which each layer must overlay increases.

The size of features being placed on wafers now is at such a tight level that even the shape of the wafer can effect the quality of the photo processes. Imagine a wafer with the shape of a potato chip. The wafer is so warped that the masks can never be aligned because the optical equipment cannot focus on the entire surface at once. This type of problem is costly to semiconductor manufacturers due to reduced yields. An instrument that accurately and reliably measures the flatness and thickness of a wafer would help these manufacturers improve their process and produce better ICs with greater yield.

The present technique that is most popular for measuring the thickness of a wafer is called a capacitance test. The wafer is placed between two electrodes and the material in between causes a change in capacitance. The change in capacitance is a direct measure of the amount and type of material between the electrodes.

For many years this technique has worked reliably. The limitations and shortcomings of this technique have only recently become significant as the accuracy of the required measurement increases and the wafers have become significantly thinner.

One of the shortcomings of this technique is that detailed information is needed about the properties of the wafer material, such as its relative permittivity. This can be problematic if the wafer has multiple materials or is bumped with solder bumps.

Another shortcoming is that the number of locations where the thickness can be measured is small, due to the relatively large size of the capacitance sensors. Typically the number of locations is about 10 for a 4-inch wafer and about 30 for a 12-inch wafer. A manufacturer would ideally want to know detailed height and thickness information over the entire wafer, not just a small number of locations. Additionally, the accuracy of the measurements is a question as the measurement is essentially an average thickness over the area of the capacitance sensor.

The area of the capacitance sensor is typically about ½ inch in diameter. More importantly, however, is that the resolution of the capacitance sensors is no longer fine enough to satisfy the increasingly tight requirements of the manufacturers. With late generation wafers having a thickness of between 800 and 200 microns, and expectations that future generations will be as thin as 40 microns, the measurement accuracy needs to be 0.1 micron or smaller.

Related to the problem of measurement of the thickness of thin wafers is the problem of measuring trench depth on wafers. When processing semiconductor wafers into devices, such as integrated circuits, micro-electro-mechanical systems (MEMS), and integrated photonic devices, manufacturers perform many processes, some of which include etching trenches into the wafer. For many of these devices, the depth of the etched trench is critical to the proper performance of the finished device, and the manufacturers typically desire to measure its depth. However, current methods of measuring the trench are severely limited.

MEMS products typically contain three-dimensional structures with regions of deep, narrow trenches with near-vertical sidewalls. A typical example is a trench etched 5 microns wide by 100 microns deep. MEMS devices with these characteristics include sensors, actuators, and RF devices such as inductors and comb switches. All of these devices characteristically require deep vertical etching processes to separate moving mechanical parts, and finger-like features are very common.

Manufacturers of MEMS devices do not currently have an accurate and inexpensive method to non-destructively measure the depth of etched high aspect ratio trenches. They need to have precise control over etch depth to produce a working device, and the measurement of etch depth is very important for process development and control. Current metrology technology cannot measure the depth of high aspect ratio trenches with speed and accuracy. Thus, the development of a non-contact metrology instrument that quickly and accurately measures the etched depth of high aspect ratio trenches, such as those formed by narrow finger-like structures, would greatly benefit MEMS manufacturers in process development and control.

Integrated circuits often require deep trenches etched in the wafer to electrically isolate neighboring circuit devices, such as transistors. Space on the wafer is always an important consideration, and yet the trench must be deep enough to provide the required isolation. Thus, the aspect ratio of these etched trenches is increasing with improvements in technology. Currently, these trenches can be one micron or smaller wide and six microns or more deep. In addition, these trenches typically have rounded or rough bottoms that absorb any incident light. Manufacturers need to measure the depth of these trenches for process control and characterization. Currently, the only method to measure these trenches involves destructively cutting the wafer.

Integrated photonics devices are typically fabricated on materials other than silicon, or in layers of materials "grown" on top of silicon. Examples are SiC, InP, GaAlAs, and silicon nitride. These devices are etched structures to form waveguides, lasers, and other photonic devices. The shape parameters of the etched structures are very important to the performance of photonic devices. The current invention relates to the measurement of deep trenches in a wide variety of materials, such as the above examples as well as the thickness of the wafer.

Because of the very steep sidewalls inherent in such trench structures, profiling instruments that use a stylus or other method of contact cannot accommodate an aspect ratio or lateral dimension of this nature. For example, atomic force microscopes (AFM) and stylus profilers are not suitable because even if the tip could penetrate the trench, it would not be able to follow the side wall, and the tip would break when exiting the trench.

Standard non-contact optical instruments for measuring surface height are confocal microscopes, white light interferometers, phase shift interferometers, and triangulation techniques. All of these optical techniques involve some manner of illuminating the trench and analyzing the reflected light. However, the steep walls of the trench prevent much of the light from reaching the bottom of the trench. In addition, some etched trenches may have rounded or rough bottoms. The light that enters these trenches might be completely absorbed. If there is no light returned, then no method of analysis can possibly determine the depth of the trench. Aside from these fundamental problems, each of the listed non-contact methods has problems unique to that particular method.

Standard confocal microscopes fail because they confuse the signal from the top of the trench with the signal from the bottom when the trench is too narrow. When the width of the trench approaches the size of the source pinhole, as much or more light will be detected when the focus is on top of the trench as when it is at the bottom. Thus, a confusing signal is generated even when the bottom of the trench is far away from the focal plane. Confocal microscopes are also very slow since they require scanning the measurement sample axially to find the plane of best focus.

White light interferometers have similar difficulties in that they are slow and must scan axially. In addition, the fringe signal is weak due to the light scattered from the walls and the top. Phase shift interferometers fail outright because phase unwrapping fails to detect steep sidewalls. Finally, triangulation techniques can only succeed if precise control of the direction of the incident beam relative to the direction of the trench is maintained so that the light can get into the trench from the side. This constraint makes such an instrument infeasible.

All of the prior art methods described above have in common the fact that they attempt to measure the trenches from above, that is, the optical beam or mechanical stylus approaches the trench from the same side as the surface that was etched.

SUMMARY OF THE INVENTION

The preferred embodiment of the present invention teaches a method and apparatus for measuring the trench depth of a wafer. The steps in the method include microscopically locating a trench on a wafer having an upper surface and a lower surface wherein the trench is on the upper surface, and positioning a non-contact optical height measurement instrument facing the lower surface so that the trench is essentially a bump on the upper surface. The non-contact optical instrument utilizes a light source such that the wafer is transparent and the non-contact optical instrument receives reflected light from the lower surface and the upper surface on the wafer such that the upper surface indicates the interior of a the trench. The height of the bump is measured by using a chromatic confocal sensor that is set in a wavelength range wherein the wafer is transparent. The depth of the trench is then determined from the height of the bump by utilizing the index of refraction of the wafer.

A second method discloses steps for measuring the localized thickness of a wafer, which has an upper surface and a lower surface. The steps include microscopically locating the area of the wafer's localized thickness, and positioning a chromatic confocal sensor on one of the surfaces of the wafer to simultaneously receive reflected light from the upper surface and the lower surface. A wavelength range wherein the wafer is transparent is utilized to calibrate the localized wafer thickness through a conversion of the measured height differences between the measured reflected wavelengths of the top upper surface and the lower surface, and the index of refraction of the wafer, thereby determining the localized thickness of the wafer.

The apparatus disclosed in the preferred embodiment also include means for measuring trench depth on a wafer or localized thickness of a wafer, the wafer having a top side and a bottom side, the apparatus comprising a non-contact optical height measurement instrument; a securing means located substantially beneath the non-contact optical height measurement instrument for positioning of the wafer; a light source set in a wavelength range wherein the wafer is transparent; the non-contact optical instrument is positioned on one side of the wafer to receive reflected light from the top surface and the bottom surface simultaneously; calibration means that converts the collected data from the non-contact optical height sensor to the distance to the top and bottom surface.

The above embodiment utilizes a silicon wafer wherein the light source is in the near infrared region, having a wavelength in the range of 900 nm to 1700 nm. The wafer is selected from the group consisting of Si, GaAs, GaAlAs, InP, SiC, $SiO_2$ or similar element.

The above embodiments utilize as the non-contact optical height measurement instrument any one of the following: a chromatic confocal sensor, white light interferometery, phase shift interferometry, scanning confocal microscopy and laser triangulation. Using chromatic confocal sensors for trench measurement is the subject of U.S. Pat. No. 7,477,401 by inventors Marx and Grant of the present invention, the technology therein being fully incorporated herein by reference. Measurement by chromatic confocal sensors is achieved through the use of axial dispersion so that each wavelength focuses at a different distance. The sensor then measures distance to the reflecting surface by determining the wavelength of light that is best reflected.

The embodiments above can be further modified by defining a calibration means that is utilized by the sensor, which converts the collected data corresponding to the wavelengths of the reflected light from the upper surface and lower surface of the wafer and the corresponding height differences into a measured thickness that determines the depth of the trench, or the localized thickness of the wafer.

The embodiments above can be further modified by defining that the optical instrument mechanically scans the wafer in transverse directions at a pre-specified sample rate and density.

The present invention also includes a method for measuring the thickness, flatness and shape of a wafer which has an upper surface and a lower surface. The method includes calibrating the distance of the wafer from a first chromatic confocal sensor and a second chromatic confocal sensor. The distance calibration further comprises placing a gage block of a known thickness and containing parallel surfaces between the first and second sensors. The first and second sensors are then adjusted in the Z plane wherein the surface being measured is placed at the center of the sensor measurement range.

The relationship between peak wavelength and object height is calibrated separately for each chromatic confocal sensor. The calibration is accomplished by the initial placement of an angle gage block of a known angle between the first and second sensors in a suitable holder with the flat surface of the angle gage block being perpendicular to the first sensor, giving a surface of known angle to the first sensor. Then the angle gage block is translated laterally in known steps so that the changes in objected height are known, and the angle gage block is rotated 180 degrees, placing the slope of the angle gage block in the opposite direction from the initial placement, with the angle gage block being perpendicular to the first sensor, thus providing a surface of a known angle to the first sensor.

The sensor height calibration is then converted mathematically, thereby determining the tilt of the angle gage block. The angle gage block is then positioned to present the angle gage block to the second sensor, repeating the steps that were performed for the first sensor. The localized thickness of the wafer is measured by placing the wafer in a holder which allows the first and second sensors to receive responses from both surfaces of the wafer.

The wafer in the holder is then positioned through a predetermined number of locations either individually at each of the locations or continuously. The height values are recorded at each of the locations or continuously. The height values are then converted to thickness values at each of the locations or continuously. The shape and shape variations of the wafer are computed through a mathematical calculation and the resulting values are displayed by a displaying means, such as a computer screen.

The preferred embodiment of the invention also includes an apparatus for measuring the thickness, flatness and localized shape of a wafer. The wafer has a an upper surface and a lower surface. The apparatus comprises a first stage for calibrating the distance of the wafer from a first sensor and a second sensor. The distance calibration further comprises placing a gage block of a known thickness and containing parallel surfaces between the first and second sensors in a holder.

The first and second sensors are adjusted in the Z plane such that the surface being measured is placed at the center of the sensor measurement range. A second stage for calibrating the sensor height comprises the initial placement of an angle gage block of a known angle between the first and second sensors in a holder. The flat surface of the angle gage block is perpendicular to the first sensor, thereby providing a surface of a known angle to the first sensor.

The angle gage block is then rotated 180 degrees, which positions the slope of the angle gage block in the opposite direction from the initial placement. The angle gage block is perpendicular to the first sensor, thereby providing a surface of a known angle to the first sensor. The height sensor calibration is collected mathematically, thereby calculating the tilt of the angle gage block.

The angle gage block is then turned to present the angle gage block to the second sensor, repeating steps as applied to the initial sensor. A third stage for measuring the localized thickness of the wafer comprises placement of the wafer in a holder, which allows the first and second sensors to receive responses from both surface of the wafer.

The wafer is then positioned in the holder through a predetermined number of locations. The height values at each location are recorded and converted to thickness values. The shape and shape variations of the wafer are then calculated through a mathematical calculation, with the calculation results being displayed through a displaying means, such as a computer screen.

DETAILED DESCRIPTION OF A PREFERRED EMBODIMENT

The invention, as shown in FIGS. 2-16, measures wafer thickness as well as the depth of any trench etched thereon. An optical stylus is used that can be considered a stylus of light. The stylus, as shown in FIG. 8, has a different wavelength focus at different axial distances. Thus, any surface that reflects the light of the optical stylus will only reflect a wavelength that is in focus. The chromatic confocal sensor relates color to height. The stylus scans the wafer with a density that is required by the user, thus acquiring thousands and potentially tens of thousands of data points by which the wafer's surface can be defined.

Wafers that have sufficient mass to support their own weight can be measured by using two optical styli, one from the top and one from the bottom. The separate surfaces acquired by the two styli are related to each other through a calibration operation. Thus, an apparatus consisting of two styli can determine the shape and calculate warp, bow and various other shape values of interest to a manufacturer. Manufacturers are then able to verify that the wafer is flat enough for processing.

Thin wafers, which are used in heat sensitive applications, can often not support their own weight if held by the side edges. The wafers are conformal, meaning they conform to the surface upon which they are placed, assuming sufficient vacuum; whereas thick wafers will not. Thick wafers maintain their shape.

Thin wafers need to be measured for proper thickness and shape because the thickness is critical to heat processing. Additionally, the upper and lower surfaces need to be parallel. Therefore, for thin wafers, a flat vacuum chuck is required to secure the wafer and the surface is measured only from the upper surface. The system will measure the surface of the vacuum chuck in a calibration procedure and reference the surface of the vacuum chuck to determine the wafer's surface shape, thickness and parallelism.

Figure 9:
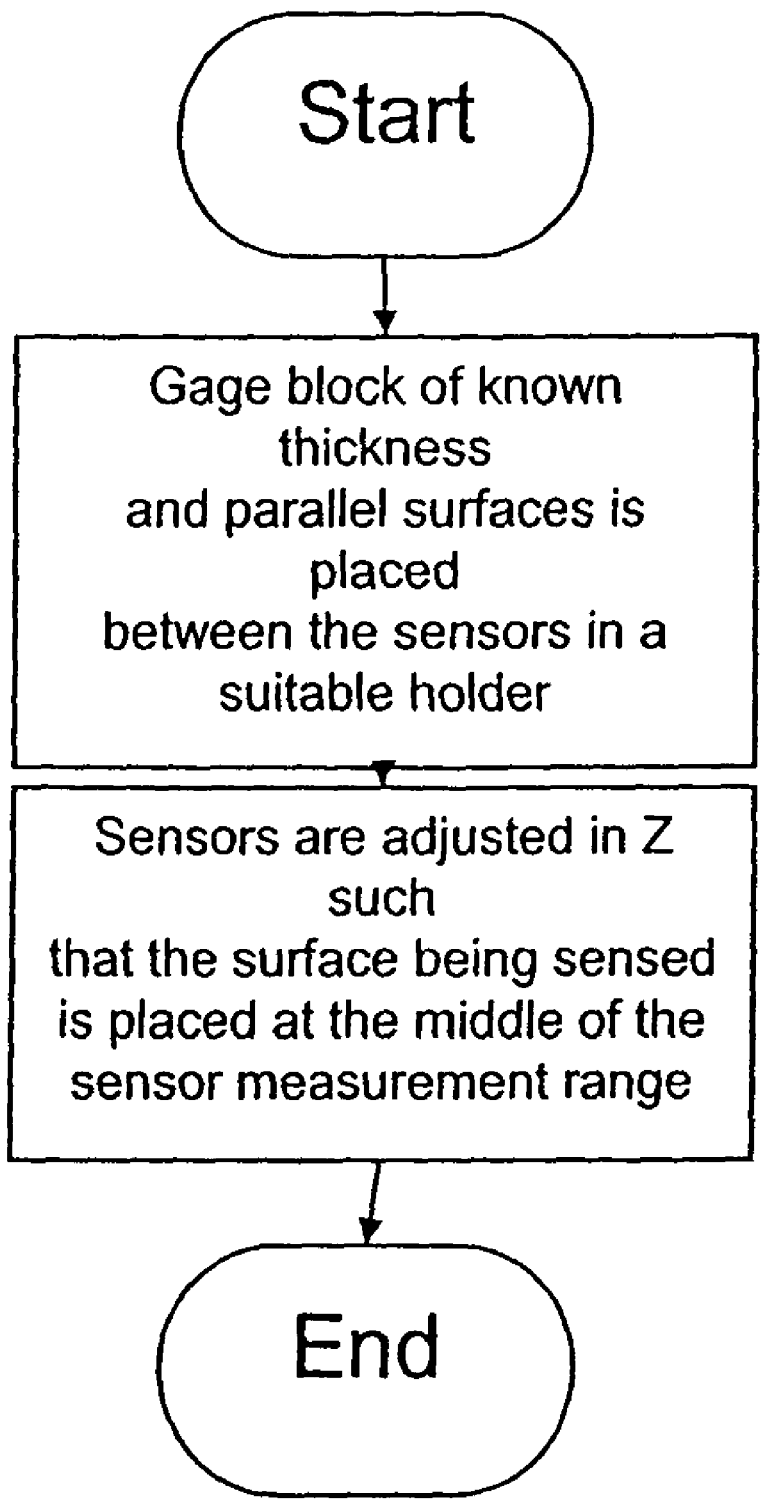
FIG. 9 is a flow chart demonstrating the sensor distance calibration for thin wafer thickness measurement.

As shown in FIG. 9, the steps for calibrating the distance a first sensor require initially placing a gage block having a known thickness and having parallel surfaces between the sensors in a holder. The sensors are then adjusted in the Z plane such that the surface being measured is placed at the center of the sensor measurement range.

Figure 10:
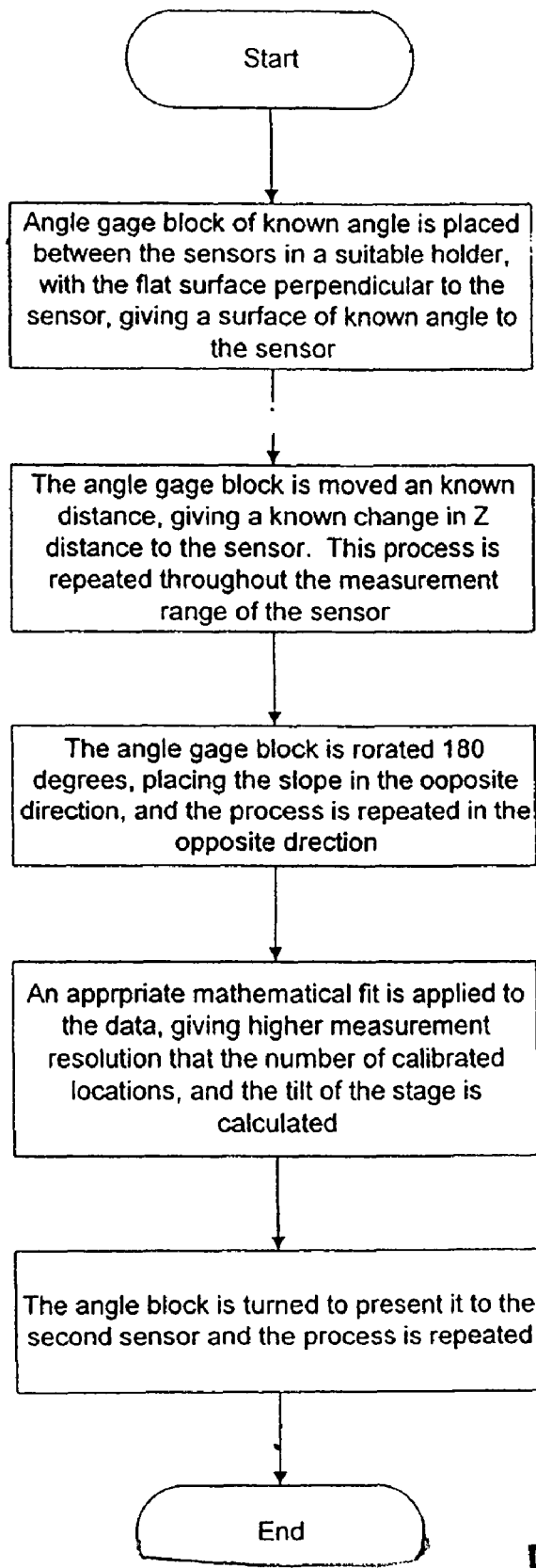
FIG. 10 is a flow chart demonstrating the sensor height calibration for thin wafer thickness measurement.

As shown in FIG. 10, the steps involved in calibrating the sensor height involve initially placing an angle gage block having a flat surface and a known angle between the sensors in a holder, with the flat surface placed perpendicular to the first sensor, thus providing a surface of a known angle to the sensor. Then, the angle gage block is moved a known distance, thus presenting a known change in the Z plane distance to the sensor. This process is repeated throughout the measurement range of the first sensor. The angle gage block is then rotated 180 degrees, placing the slope in the opposite direction, and the process is repeated. A mathematical fit is applied to the acquired data, giving higher measurement resolution than the number of calibrated locations, and the tilt of the angle gage block's mounting surface is calculated. Finally, the angle block is positioned to present it to the second sensor and the process is repeated.

Figure 11:
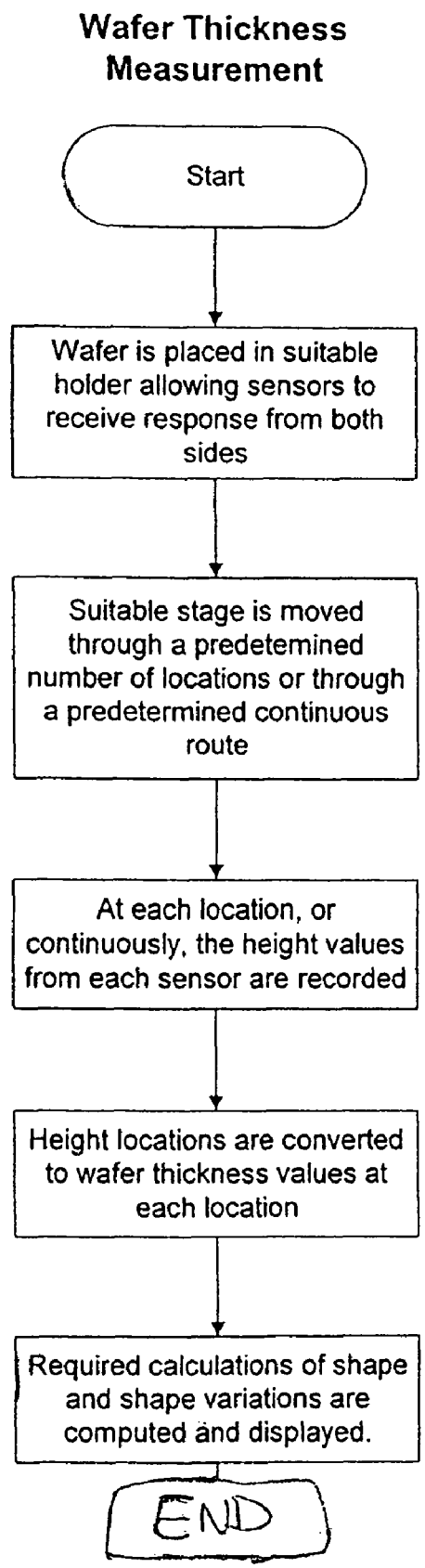
FIG. 11 is a flow chart demonstrating the wafer thickness measurement steps for thin wafer thickness measurement.
Figure 12:
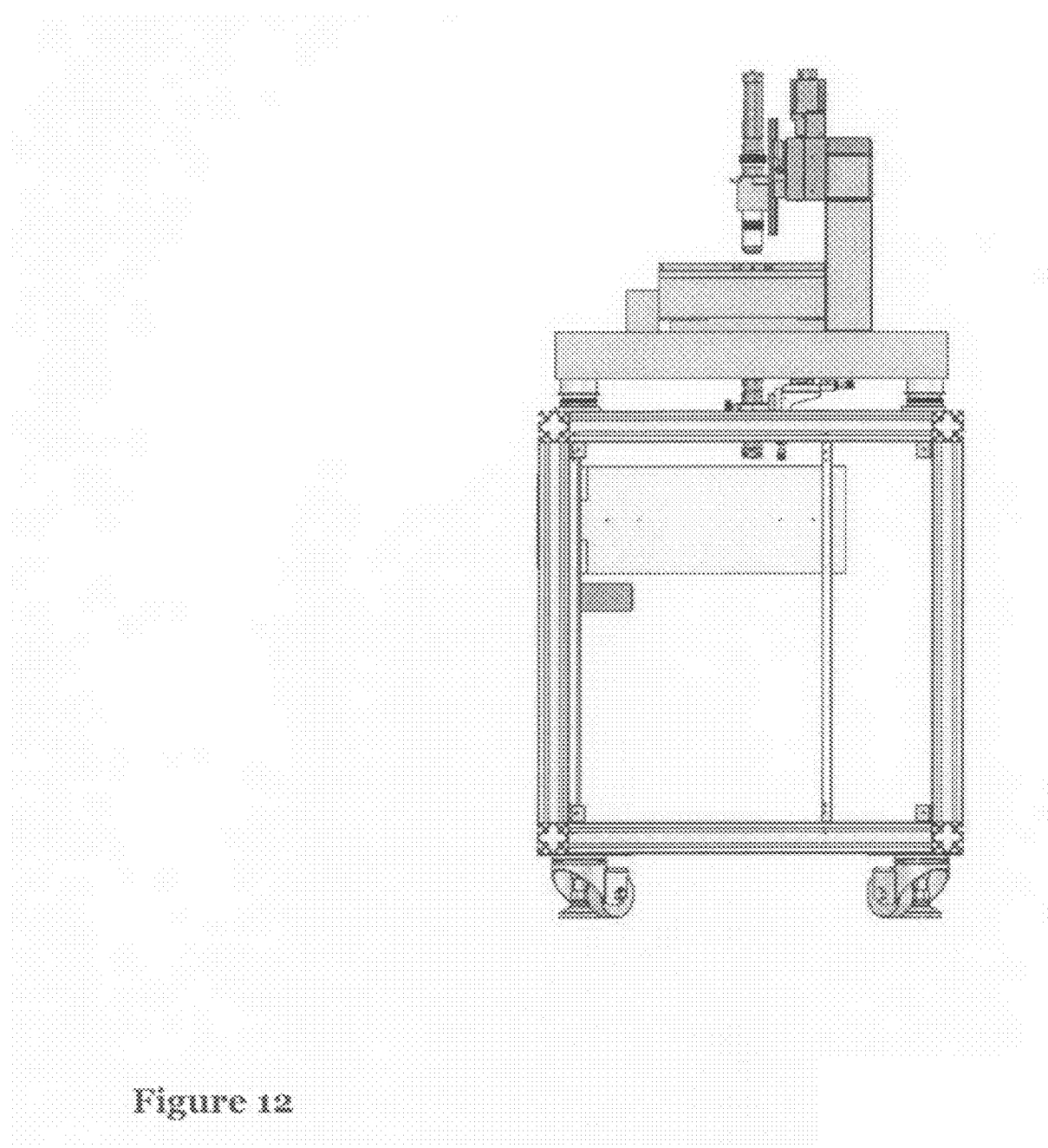
FIG. 12 is a side view of the apparatus for measuring wafer thickness and flatness.
Figure 13:
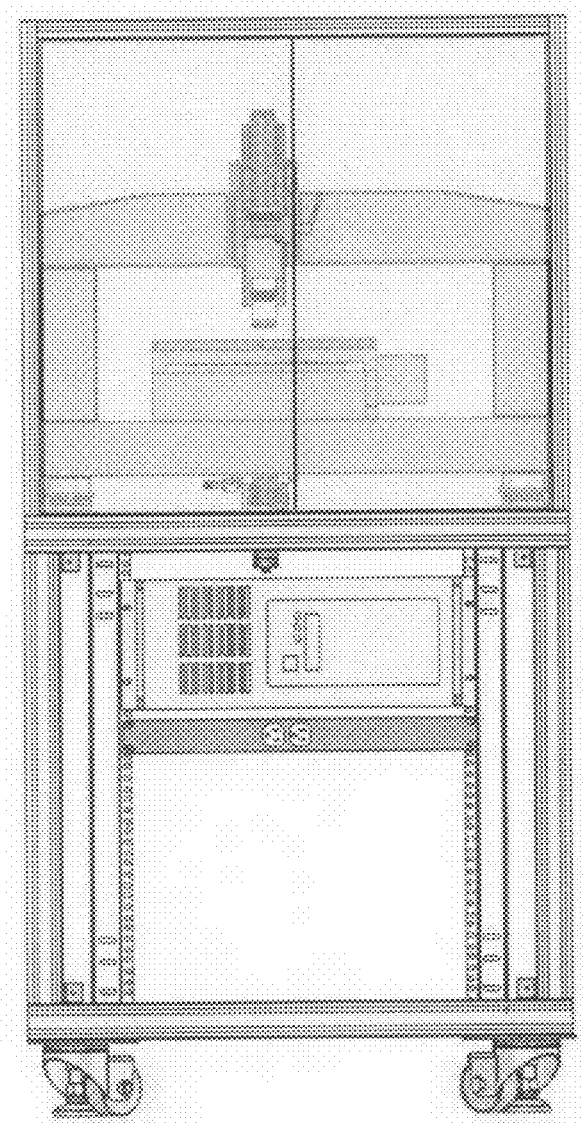
FIG. 13 is a front view of the apparatus for measuring wafer thickness and flatness.
Figure 14:
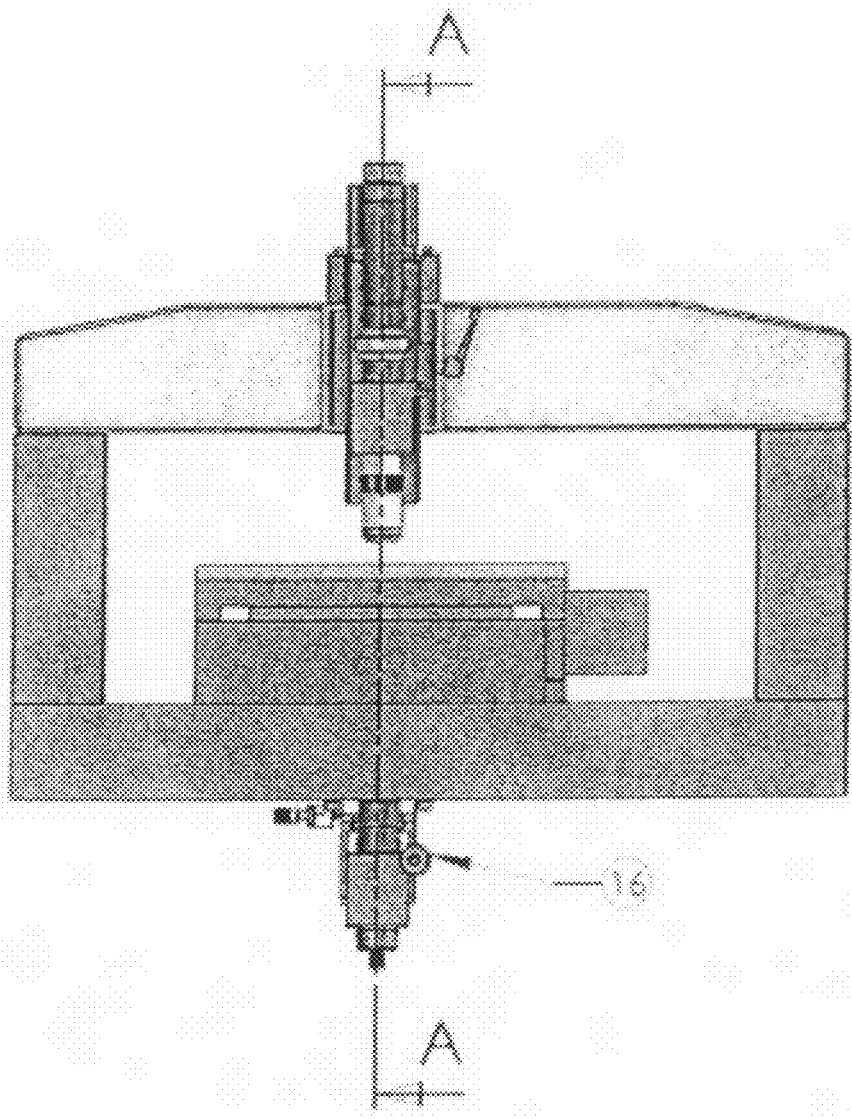
FIG. 14 is close up view of the apparatus for measuring wafer thickness and flatness.

FIG. 11 illustrates the steps for measuring wafer thickness. First, the wafer is placed in a holder which allows the sensors to receive responses from both surfaces. The angle gage block's mounting surface containing the wafer is moved through a predetermined number of locations or through a predetermined continuous route. At each location the height values from each sensor are recorded and converted to wafer thickness values. The shape and shape variations are then computer and displayed.

Figure 15:
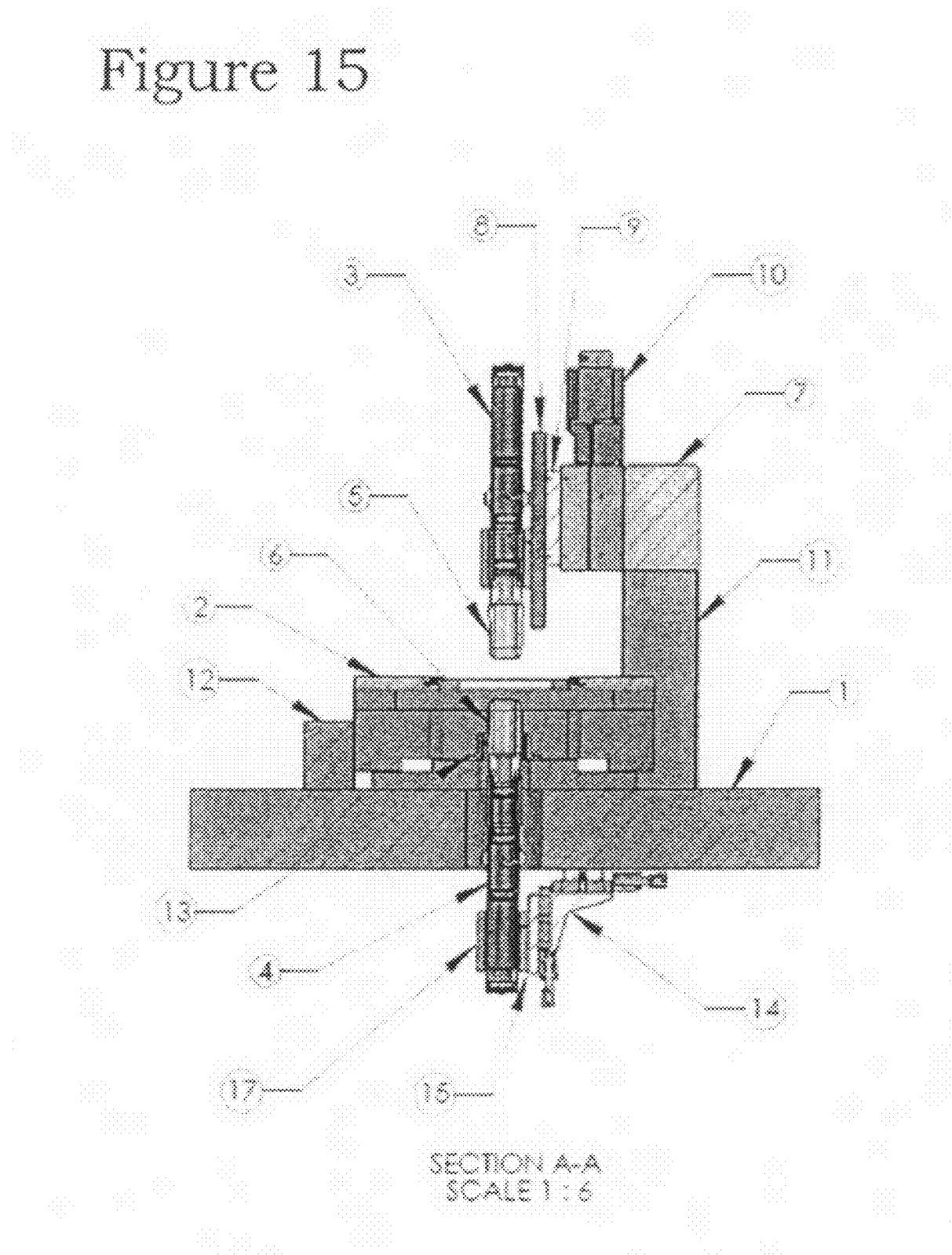
FIG. 15 is a cross section view of the area marked A-A in FIG. 14.

The thickness and flatness measurements are made on an apparatus as illustrated in FIGS. 12-15. A frame 18 holds the apparatus, and FIG. 15 shows each component part of the measurement subsystem for the apparatus utilizing two sensors in detail. A granite base 1 is the principle structural support for the measurement system. A vacuum chuck 2 holds the wafer to be measured and keeps the wafer stationary.

A top height sensor 3 is comprised of an optical stylus as described in U.S. Pat. No. 7,477,401 to Grant and Marx. The top height sensor, along with an objective lens 5 measures the upper surface of the wafer. The bottom height sensor 4 is another optical stylus that measures the lower surface of the wafer.

There is an objective lens 5 for the top height sensor and another objective lens 6 for the bottom height sensor. A granite bridge 7 provides structural support for mounting the top height sensor over the wafer. A dovetail mount 8 is used as a transfer plate for mounting the top height sensor to a motorized stage 10.

A clamp 9 secures the dovetail mount 8 and mounts to the motorized stage 10. The motorizes stage 10 is for moving the top sensor 3 closer to or further away from the wafer. The top sensor 3 is moved so that the upper surface of the wafer is within the sensor's 3 measurement range. After this movement, the distance between the top and bottom sensors is calibrated.

Granite columns 11 provide structural support for the granite bridge 7. A 6"×6" motorizes stage 12 is used to move the wafer in the plane between the top 3 and bottom sensors 4. Wafer thickness and flatness is measured by recording the top 3 and bottom 4 sensor measurements while the stage 12 is translating the wafer.

A stage bracket 13 is used to provide structural support for the bottom sensor 4. An XYZ stage 14 provides alignment for the bottom sensor 4. A microscope mount bracket 15 transfers the plate to mount the bottom sensor 4 to the XYZ stage 14. A cinch stud 16 tightens the bracket 17 that holds the optical stylus sensors 3, 4 and mounts to the dovetail mount 8 or the microscope mount bracket 15. The frame 18 creates a table for supporting the granite base 1 and also holds any required electronic accessories.

Figure 1:
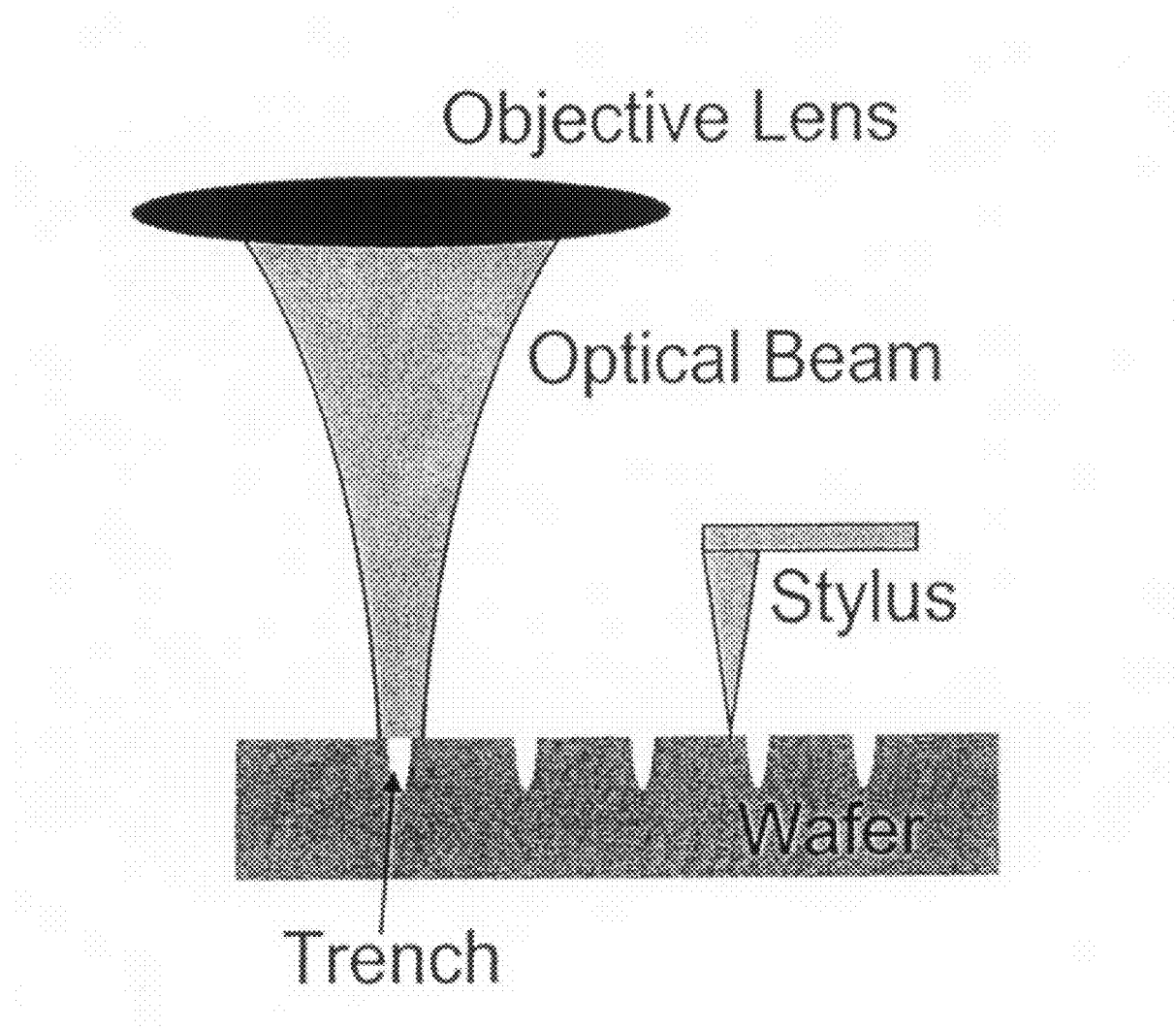
FIG. 1 is a view of the prior art technique for the measuring wafer thickness and trench depth.
Figure 2:
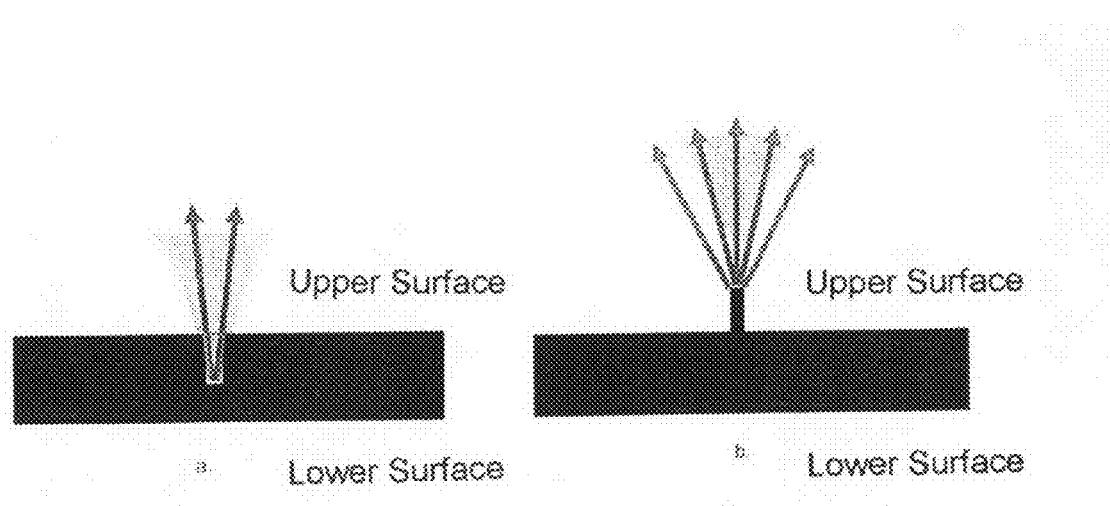
FIG. 2 includes a first diagram that shows incident light and reflected light on a trench and a second diagram that shows incident and reflected light on a bump.

Many optical systems that are not capable of measuring the depth of a trench are capable of measuring the height of a bump. In contrast to a trench, the incident light on a bump is not even partially blocked. FIG. 2 illustrates this difference in how light is reflected when transmitted into a trench versus how it is reflected when it is transmitted onto a bump. As can be seen from FIG. 2, reflected light from the bump creates more data points than light reflected from a trench, thereby giving a more accurate reading. The light reflected from the top of a bump returns directly to the sensor without the occurrence of multiple reflections. No matter how tall the bump, its reflection properties will be similar, unlike a deep trench which inherently reflects less light because of the obstruction of the side walls.

Figure 6:
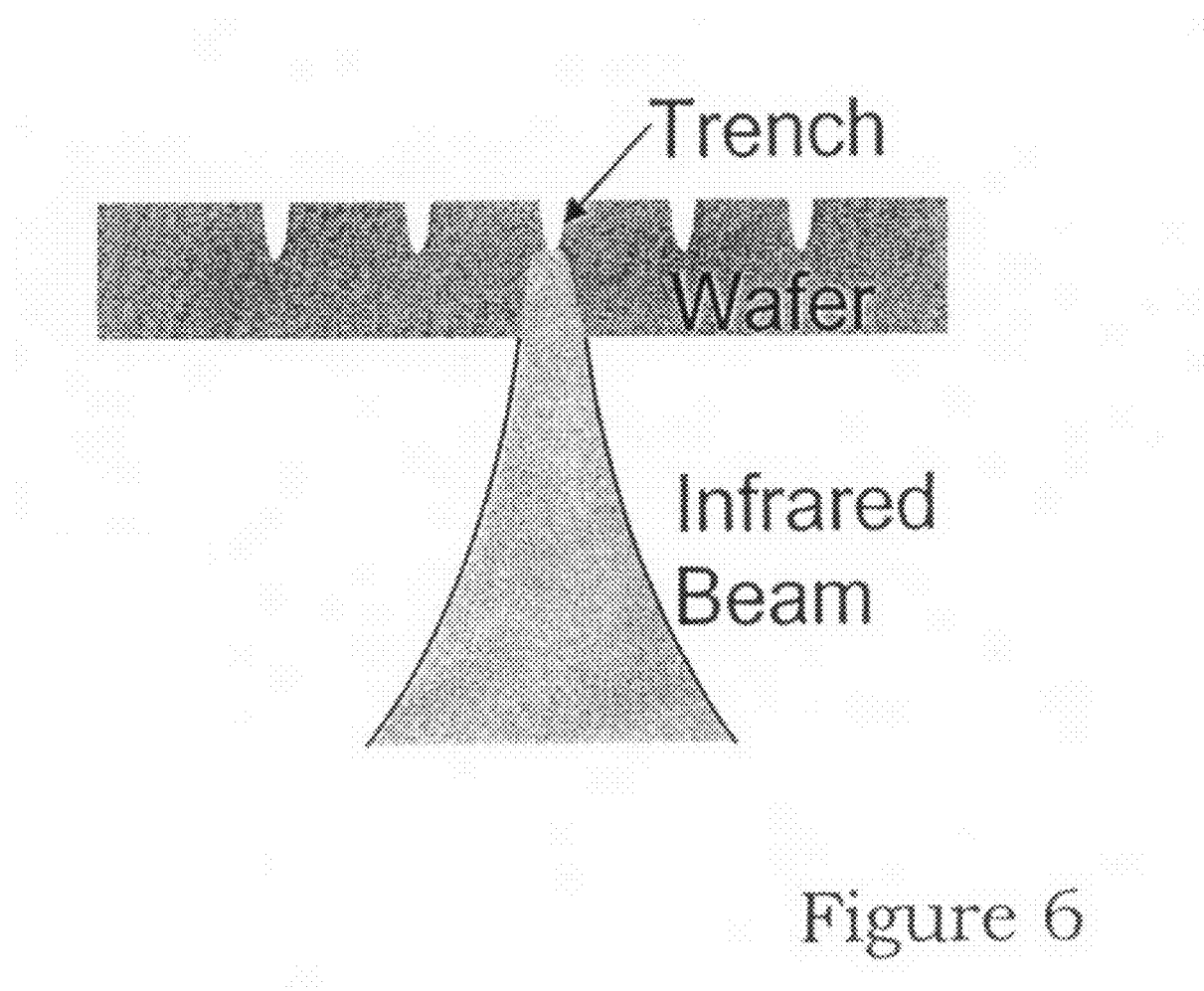
FIG. 6 is a diagram that shows the preferred embodiment of the instant invention as it uses an infrared beam to look through the back of a wafer, thereby effectively rendering the depth a bump as viewed from the back.

While a rounded and rough trench might absorb all of the incident light, a rounded and rough bump will always reflect some light, as shown in FIG. 6. In fact, no matter how narrow a bump is at its apex, it will always reflect some light. All of these differences indicate that a bump is much easier to measure than a trench. An etched trench viewed from the reverse side appears as a bump to the sensor, and so its height (depth) becomes much easier to measure.

Figure 5:
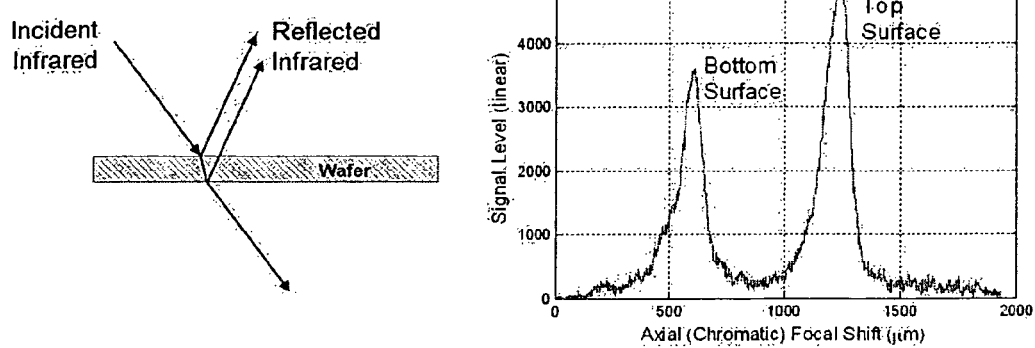
FIG. 5 demonstrates an experiment for wafer thickness showing how when a chromatic confocal sensor is operating in the visible spectrum, it simultaneously measures the axial separation between the top and bottom surfaces of a glass microscope slide.

Most optical height measuring systems currently on the market typically operate using visible light. However, silicon is opaque to visible light. FIG. 5 shows the instant invention operating in the visible spectrum as it measures the thickness of a glass slide. The instant invention uses infrared light, specifically light with wavelengths longer than 900 nm, where silicon is transparent. While silicon is specifically discussed herein as it is the most common wafer substrate, the present invention can be used for wafers of many different materials, such as glass, SiC, InP, GaAs, or any transparent material. The following description utilizes infrared light as the source. However, the present invention can use any wavelength band where the material of interest is transparent.

Figure 3:
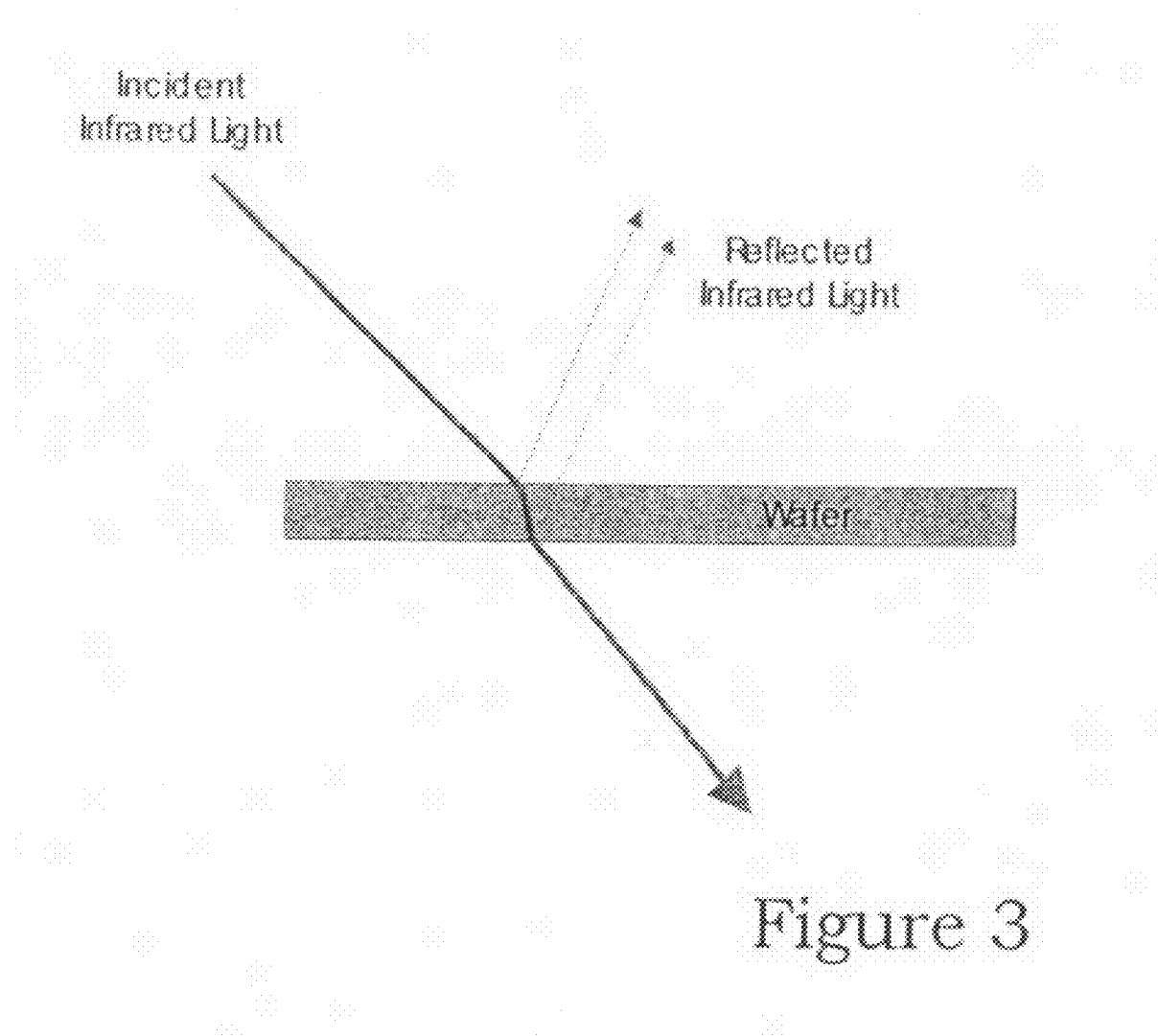
FIG. 3 demonstrates how light is reflected from both the top and bottom surfaces of a silicon wafer.
Figure 4:
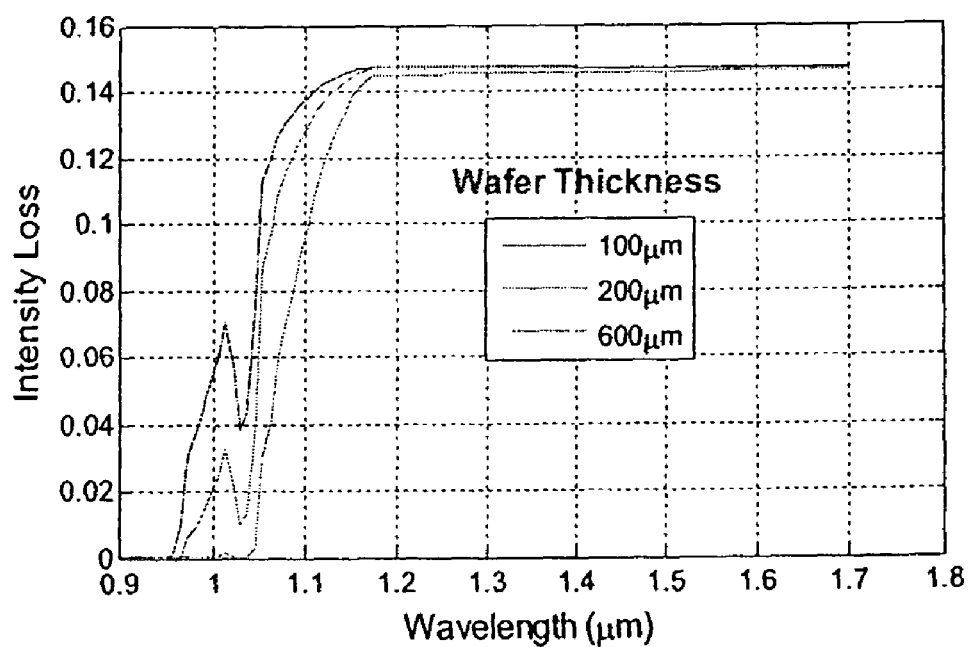
FIG. 4 a wavelength vs. intensity loss graph that demonstrates light intensity reflected from the bottom surface of a silicon wafer relative to the intensity of the incident light, for each wavelength in the near infrared spectrum. Note how silicon absorbs light with wavelengths shorter than approximately 1.1 µm.

As shown in FIG. 4, silicon is transparent to wavelengths longer than µ1.1 m. The index of refraction of silicon at a wavelength of 1.1 µm is approximately 3.5, and so the reflection of a normally incident beam of light at an air/silicon interface is approximately 31%. The remainder of the light is transmitted through the silicon. A similar percentage of transmitted light reflects off the bottom silicon/air interface. Thus, a single sensor positioned on one side edge of a silicon wafer can receive reflected light from both the upper and lower surfaces of the wafer. FIG. 3 shows the relative signal level received from the lower surface of a silicon wafer after propagating through the wafer twice (incident and reflected).

As shown in FIG. 6, the preferred embodiment illuminates the wafer on the surface opposite that of the etched trenches. Since the wafer is transparent, light is reflected back from the surface where the trenches are etched. Thus, a non-contact height sensor is able to measure the contour of the trench using the reflection from the etched surface. Since the trenches appear as bumps, none of the disadvantages inherent when viewed as a trench, such as the trench sidewalls absorbing light are encountered.

Figure 7:
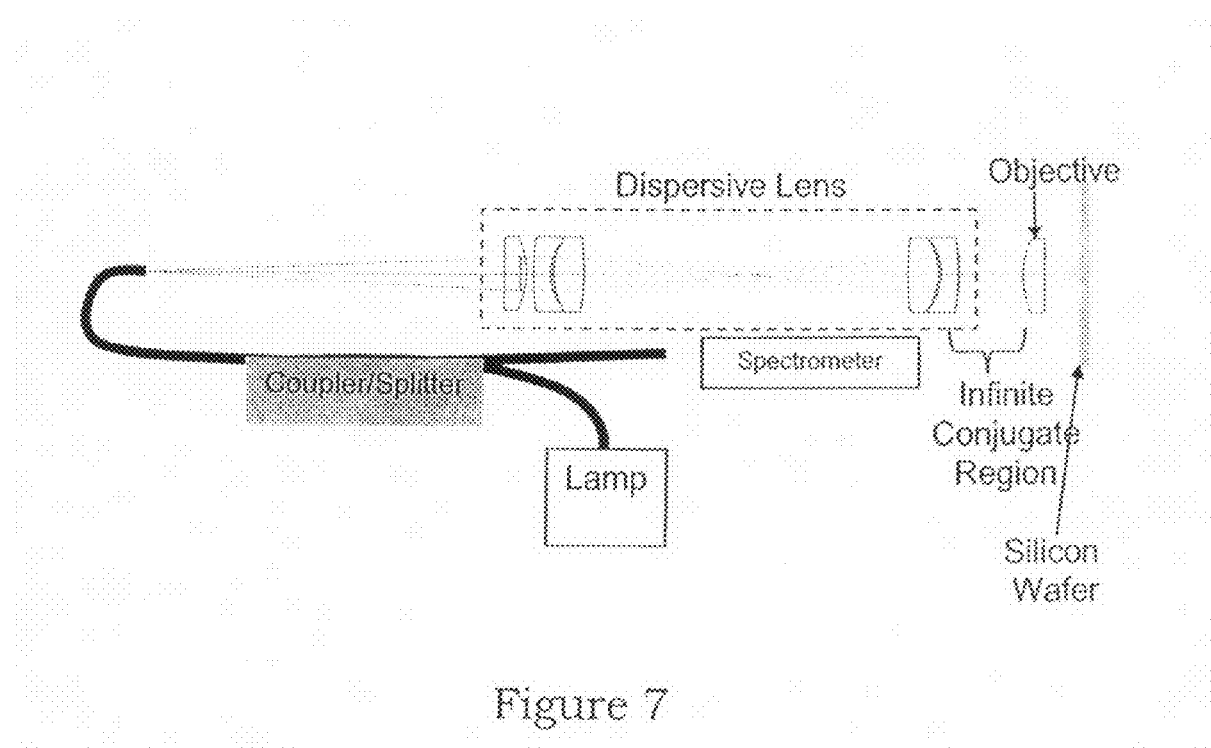
FIG. 7 shows a schematic view of a chromatic confocal system for the measurement of trenches.
Figure 8:
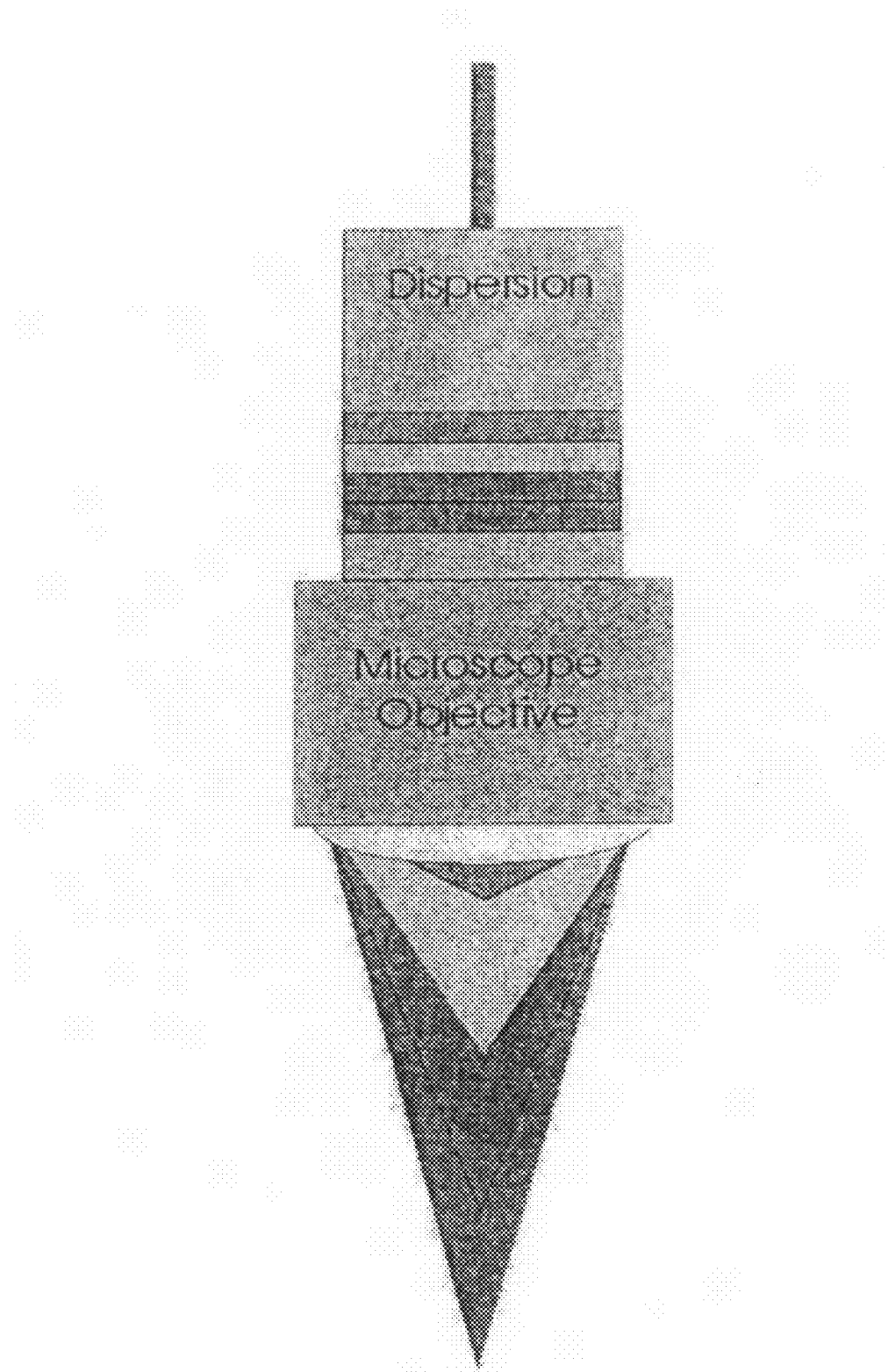
FIG. 8 shows the optical stylus of the present invention.

While many different non-contact height sensors can be used in the present invention to measure the height of the bumps (depth of the trenches), the preferred embodiment utilizes a chromatic confocal sensor, which is schematically shown in FIG. 7. Other possibilities are: while light interferometry, phase shift interferometry, scanning confocal microscopy, and laser triangulation. The preferred embodiment is specifically designed to utilize a chromatic confocal sensor which operates in the near infrared (NIR) region of the spectrum, from 900 nm to 1700 nm, to measure the thickness of a wafer by simultaneously measuring the distances to the upper and lower surfaces. The method of calibration, relating the measured separation between the two reflected waves to actual wafer thickness, is not obvious and is an integral part of the invention. As discussed previously, a similar system can also measure trench depth by simultaneously measuring the distances to the upper and lower surfaces.

Chromatic confocal sensors are well known to those familiar with the art of optical measurements. This type of sensor spreads a focused spot along the axial direction according to the color, or wavelength, of the light (FIG. 7). Thus, each wavelength focuses at a different level, and if an object is present, only one wavelength will be in focus on the object.

As a result, the chromatic confocal sensor then relates color to height if it can detect which wavelength is in focus on the object. This detection is performed by a spectrometer. The preferred embodiment of a complete chromatic confocal system, as shown in FIG. 7 includes a broad band, white source, a dispersive optical system a spectrometer, and fiber coupler/splitter to connect the dispersive optical system to the source and spectrometer, and to provide the confocal source and detector apertures. Many other configurations are possible.

The chromatic confocal sensor is also easily integrated with a microscope imaging system that shares the objective lens with the confocal sensor. The microscope provides an image of the object and provides an immediate reference for the location of the confocal measuring spot. For example, the measurement of wafer thickness, after plating the wafer with solder bumps, can be conducted using the microscope image to guide the measurement spot around the solder bumps. Another example is the measurement of pressure sensor diaphragms. These diaphragms are etched from the lower surface of the wafer to form a thin membrane of silicon for each die. The measurement of these diaphragms is impossible with capacitance sensors because of their small dimensions. However, a chromatic confocal sensor with an integrated microscope easily locates the diaphragm and measures the thickness at a localized area on the wafer. The integrated microscope is also important for the trench measurement. For this application, the microscope is necessary to locate the trench so that it can be measured.

If an object is transparent, as is silicon in the NIR spectrum, a reflection from both the upper and lower surface of the object will be returned to the spectrometer. Since there is a difference in height from the upper surface and the lower surface of the wafer, the light reflected from each surface will have a different wavelength. FIG. 5 shows the relative intensities of the reflections from the top and bottom of a glass slide in the visible spectrum. An analogous result is achieved when measuring silicon wafers in the NIR. In general, chromatic confocal sensors are designed so that shorter wavelengths focus before longer wavelengths, although it is possible to design a sensor with the opposite relationship. In the preferred embodiment, the light focused on the upper surface of the wafer has a shorter wavelength than the light focused on the lower surface. When these reflections pass through the spectrometer, the spectrometer shows two wavelength peaks. The location of each peak indicates the location of each surface, and the difference in peaks indicates the thickness of the wafer.

The sensor mechanically scans the wafer in transverse directions with a sample rate and data density specified by the user. Thousands and potentially tens of thousands of data points are thus acquired. The sensor has a spot size approximately 5 microns, thereby providing surface and thickness measurements that are highly localized. As the sensor is positioned on the wafer, the locations of the peaks will change as a function of the shape of the wafer surface, and the relative locations of the peaks will change as a function of thickness. Thus, the complete shape of the wafer is derived as well as the localized thickness of an area on the wafer.

There are no known chromatic confocal sensors designed to operate in the NIR. The design of a chromatic confocal sensor requires the use of dispersive materials to spread the wavelengths along the axis of focus. While many different materials are available to provide sufficient dispersion in the visible spectrum, the necessary dispersion in the NIR is more difficult to achieve. However, doublet lenses can be designed to provide axial dispersion as well as correcting for spherical aberrations. One example uses S-TIH53 and N-SSK8 lenses, and another example uses S-TIH53 and N-SK4 lenses. May other examples can be designed, including using S-NPH1 in place of S-TIH53. To increase the amount of axial dispersion in a system, several such doublets can be used in a serial configuration. Another method to create an axial dispersive lens system is by utilizing diffractive lenses in combination with refractive lenses.

Calibration is a critical issue for this invention. The measurement of the lower surface is complicated by the effects of focusing through the wafer substrate. One effect is the addition of spherical aberrations, which will effectively spread the focused spot on the lower surface and reduce axial resolution.

Spherical aberrations can be minimized through proper design of the focusing lens system. Another effect is the difference between physical length and optical path length when light propagates through a medium. The chromatic confocal sensor measures optical path length, whereas the quantity of interest is physical length, or thickness, of the wafer. The measured thickness is roughly equal to the physical thickness divided by the index of refraction of the wafer. However, the index of refraction varies with wavelength. The axial focus position of each wavelength in the silicon is approximately, $z(\lambda) = z(\lambda) n(\lambda)$, where $z$ is the axial focus position in air, n is the index of refraction of silicon, and $\lambda$ indicates that each of these quantities depend on wavelength.

Figure 16:
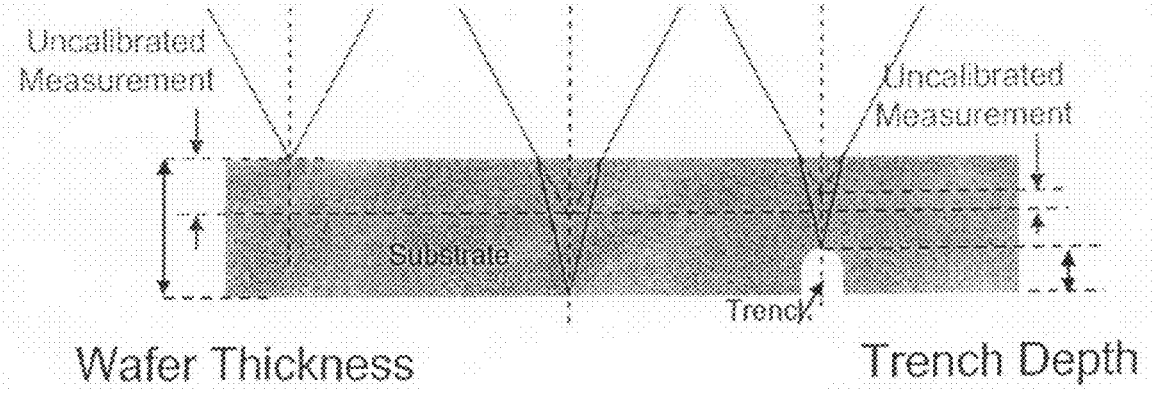
FIG. 16 illustrates how the index of refraction of a silicon medium affects measurement calibration.

FIG. 16 demonstrates how the index of refraction of a silicon medium affects measurement calibration. Because of the refraction at the silicon surface, the chromatic confocal sensor measures to a point inside the wafer. Both the wafer thickness, as shown in FIG. 16, and the trench measurement (seen on the right in FIG. 16) are affected.

FIG. 16 further illustrates the measurement of a trench while accounting for the refraction. The "raw" measurement is the apparent axial location of the confocal spots as measured by the calibrated spectrometer, but the "desired" measurement is the depth of the trench.

A geometric optics analysis using Snell's Law shows that the "desired" measurement is simply equal to the "raw" measurement scaled by the index of refraction. Therefore, if the spectrometer response is calibrated to the confocal response in air, then the measurement of the trench depth in the substrate medium is simple. Alternatively, the spectrometer response can be directly calibrated using a step height gage fabricated from the same material as the substrate.

The chromatic axial focal shift that gives rise to the confocal signal is affected by the refractive index of the medium. A standard method for calibrating chromatic confocal systems in air is to use an angled gage block scanned with precise lateral motion. Such a calibration will provide a look up table between object height and wavelength peak. However, this calibration table would be incorrect in a medium other than air. The appropriate calibration table can be estimated by multiplying the object heights by the index of refraction. However, the index variation with wavelength must be accounted for. Alternatively, a calibration gage can be fabricated in silicon so that a direct calibration can be made.

The illustrations and examples provided herein are for explanatory purposes and are not intended to limit the scope of the appended claims. This disclosure is to be considered an exemplification of the principles of the invention and is not intended to limit the spirit and scope of the invention and/or claims of the embodiment illustrated. Those skilled in the art will make modifications to the invention for particular applications of the invention.

What is claimed is:

1. A method for measuring trench depth on a wafer, wherein said method comprises the following steps:
    a) procure a wafer that is transparent, has a lower surface and an upper surface having a high aspect ratio trench,
    b) position a non-contact optical height measurement instrument facing said lower surface,
wherein the bottom of said trench is closer to the instrument than the upper surface of said wafer, wherein said non-contact optical height measurement instrument utilizes a light source, and receives the reflected light from said upper surface of said wafer,
    c) measure the distance to the upper surface and the distance to the bottom of the trench by utilizing the non-contact optical height measurement instrument; and
    d) determine the depth of said trench by subtracting the two measurements taken in step c) and utilizing the index of refraction of the wafer.

2. The method according to claim 1 wherein said wafer is made of a material that is selected from the group consisting of Si, GaAs, GaAlAs, InP, SiC, $SiO_2$.

3. The method according to claim 1 wherein said non-contact optical height measurement instrument is comprised of a chromatic confocal sensor.

4. The method according to claim 1 wherein said non-contact optical height measurement instrument uses scanning confocal microscopy.

5. The method according to claim 1 wherein said non-contact optical height measurement instrument mechanically scans said wafer in transverse directions at a pre-specified sample rate and density.

6. The method according to claim 1 wherein the width and depth of a high aspect ratio trench is determined by utilizing the following formulae:

a) width<=wavelength/$NA$, and b) depth>=wavelength/$2*NA^2$ where $NA$=numerical aperture.

7. A method for measuring the thickness, flatness and shape of a thin wafer having an upper surface and a lower surface, wherein said method utilizes a chromatic confocal height sensor that is calibrated by performing the following steps:
    a) calibrate the distance of said wafer from a first chromatic confocal sensor and a second chromatic confocal sensor, said distance calibration further comprising the following steps:
    b) measure the thickness of said wafer, said measurement further comprising the following steps:
        (1) place said wafer in a holder, allowing said first and second sensors to receive responses from both the upper and the lower surfaces of said wafer;
        (2) position said wafer in the holder at a predetermined number of locations;
        (3) record the height values at each of the locations;
        (4) convert the height values to thickness values at each of the locations;
        (5) compute the shape said wafer by use of a mathematical calculation; and
        (6) display said mathematical calculation of the shape and the shape variations by utilizing a displaying means,
    c) calibrate the sensor height by performing the following steps:
        (1) initially place an angle gage block having a flat surface and a surface of known angle between said first and second sensors in a holder, with the flat surface of the angle gage block placed perpendicular to said first sensor, thus providing the surface of a known angle to said first sensor;
        (2) rotate the angle gage block 180 degrees, placing the slope of the angle gage block in the opposite direction from the initial placement with the flat surface of the angle gage block placed perpendicular to said first sensor, thus providing a surface of a known angle to said first sensor;
        (3) convert the collected height sensor calibration mathematically, thereby determining the tilt of the angle block; and
        (4) rotate the angle gage block to present the surface of a known angle to said second sensor, repeating steps that were performed for said first sensor.

8. The method according to claim 7 wherein when said wafer is made of Si, GaAs, GaAlAs, InP, the light source has a wavelength spectrum within the range of 900 nm to 1700 nm.

9. The method according to claim 7 wherein said wafer is made of SiC or $SiO_2$, the light source has a wavelength spectrum within the range of 200 nm-1700 nm.

* * * * *